United States Patent
Okada et al.

[11] Patent Number: 6,140,766
[45] Date of Patent: Oct. 31, 2000

[54] ORGANIC EL DEVICE

[75] Inventors: Hiroyuki Okada; Shigeki Naka; Hiroyoshi Onnagawa, all of Toyama; Morimitsu Wakabayashi, Osawano-machi; Hajime Yamamoto, Osawano-machi; Shigeru Fukumoto, Osawano-machi; Tetsuya Tanbo, Osawano-machi, all of Japan

[73] Assignee: Hokuriku Electric Industry Co., Ltd., Toyama Pref., Japan

[21] Appl. No.: 09/221,238

[22] Filed: Dec. 28, 1998

[30] Foreign Application Priority Data

Dec. 27, 1997 [JP] Japan ................. 9-369327
Apr. 20, 1998 [JP] Japan ................. 10-125341

[51] Int. Cl.[7] .............. H05B 33/02; H01J 1/02
[52] U.S. Cl. ............ 313/506; 313/504; 313/505; 313/509
[58] Field of Search .................. 313/500, 504, 313/505, 506, 509; 428/690, 917; 315/169.3

[56] References Cited

U.S. PATENT DOCUMENTS

| | | | |
|---|---|---|---|
| 4,777,403 | 10/1988 | Mitsumori | 313/509 |
| 5,400,047 | 3/1995 | Bessely | 313/505 X |
| 5,670,792 | 9/1997 | Utsugi et al. | 313/504 X |
| 5,896,006 | 4/1999 | Kusaka et al. | 313/512 X |

*Primary Examiner*—Ashok Patel
*Attorney, Agent, or Firm*—Pearne & Gordon LLP

[57] ABSTRACT

An organic EL device capable of providing an image plane which exhibits increased luminance or brightness while eliminating any difference in luminescence between luminous sections. An electrically insulating layer is arranged so as to cover both a first wiring pattern and a second wiring pattern and formed with a plurality of hole arrays in a manner to respectively correspond to first electrodes. The hole arrays each are constituted of a plurality of holes arranged along the first electrode corresponding thereto and so as to extend through an insulating layer to the first electrode while being kept from extending through second electrodes. A third wiring pattern is arranged which is constituted of a plurality of conductive paths each arranged on the insulating layer so as to be in alignment with each of the hole arrays and electrically connected to each of the first electrodes through connection conductive sections formed in the holes of the hole array corresponding thereto.

16 Claims, 9 Drawing Sheets

ORGANIC EL DEVICE

BACKGROUND OF THE INVENTION

This invention relates to an organic electroluminescent (hereinafter referred to as "EL") device, and more particularly to an organic EL device used for a plane light source, a plane display device or the like and a method for manufacturing the same.

In manufacturing of an organic EL device which has been conventionally executed, a light-permeable indium-tin oxide (ITO) film is first formed all over a front surface of a glass substrate in a vacuum atmosphere. Then, the ITO film is formed into a stripe-like shape by etching, resulting in a plurality of transparent electrodes or first electrodes being provided which are arranged in juxtaposition to each other while being spaced from each other at predetermined intervals. Then, the transparent electrodes are formed thereon with a hole transport layer, which is made of a hole transport material such as a triphenylamine derivative (TPD) or the like by vacuum deposition. Subsequently, a layer made of an electron transport material such as an aluminum quinolinol complex ($Alq_3$) acting as a luminous material is laminated on the hole transport layer, resulting in a luminous material layer being formed by vacuum deposition. Then, Al, Li, Ag, Mg, In or the like is deposited in a stripe-like manner on the luminous material layer so as to extend in a direction perpendicular to a pattern of the transparent electrodes, to thereby provide a plurality of rear electrodes or second electrodes. Such construction permits portions of the luminous material layer positioned at intersections between the transparent electrodes and the rear electrodes to define luminous sections, resulting in forming a dot matrix. In operation of the organic EL device thus constructed, a current is flowed to the luminous sections positioned on the intersections between the transparent electrodes acting as anodes and the rear electrodes acting as cathodes, leading to luminescence of the luminous sections.

In order to carry out either fine display or display on a large image plane by means of such a dot matrix, it is required to increase the number of dots. This requires to reduce a thickness of the transparent electrodes and increase a length thereof, leading to an increase in resistance of the transparent electrodes. Such an increase in resistance causes the transparent electrodes to be varied in resistance, to thereby cause a current flowed to the luminous sections to be varied, resulting in luminance or brightness of display on the image plane being rendered nonuniform.

Also, in simple matrix driving wherein the luminous sections are subsequently scanned for luminescence, lines from the transparent electrodes and rear electrodes are subsequently selected one by one to carry out luminescence of each of the luminous sections. This causes a period of time for which a current is flowed to each one of the transparent electrodes to be proportional to an inverse of the number of transparent electrodes. Thus, an increase in number of transparent electrodes causes luminous time of the luminous sections to be reduced correspondingly. Also, an increase in number of dots for the purpose of increasing definition of the image plane causes the transparent electrodes and rear electrodes to be reduced in width, to thereby render connection of external wirings to the transparent and rear electrodes highly troublesome and difficult.

SUMMARY OF THE INVENTION

The present invention has been made in view of the foregoing disadvantage of the prior art.

Accordingly, it is an object of the present invention to provide an organic EL device which is capable of permitting an image plane to exhibit increased luminance or brightness while eliminating any difference in luminescence between luminous sections.

It is another object of the present invention to provide an organic EL device which is capable of facilitating feeding of a current to transparent electrodes.

In accordance with the present invention, an organic EL device is provided. The organic EL device includes a transparent insulating substrate, a first wiring pattern constituted of a plurality of first electrodes formed of a transparent electrode material and arranged on a front surface of the insulating substrate in a manner to be spaced from each other at predetermined intervals while being juxtaposed to each other, and a luminous material layer made of an organic EL material and including a plurality of luminous sections arranged on the first electrodes in a manner to be spaced from each other at predetermined intervals in a direction in which the first electrodes extend. The luminous material layer may be constituted of a plurality of luminous material arrays positioned below the second electrodes and arranged so as to intersect the first electrodes. Alternatively, the luminous material layer may be arranged so as to cover the whole front surface of the insulating substrate on which the first wiring pattern is formed, as described hereinafter.

The organic EL device also includes a second wiring pattern constituted of a plurality of second electrodes which are formed on the luminous material layer and arranged so as to intersect the first electrodes and in a manner to be juxtaposed to each other while being spaced from each other at predetermined intervals. The luminous sections each are defined at each of intersections between the first electrodes and the second electrodes.

Also, the organic EL device includes an electrically insulating layer arranged so as to cover the first wiring pattern and second wiring pattern. The insulating layer is formed with a plurality of hole arrays in a manner to respectively correspond to the first electrodes. The hole arrays each are constituted of a plurality of holes arranged along the first electrode corresponding thereto and so as to extend through the insulating layer to the first electrode while being kept from extending through the second electrodes. The holes of each of the hole arrays each are formed therein with a connection conductive section. In addition, the organic EL device includes a third wiring pattern constituted of a plurality of conductive paths each arranged on the insulating layer so as to be in alignment with each of the hole arrays and electrically connected to each of the first electrodes through the connection conductive sections formed in the holes of the hole array corresponding thereto.

When the luminous material layer is arranged so as to cover the whole front surface of the insulating substrate on which the first wiring pattern is formed, the holes of each of the hole arrays are formed so as to extend through the luminous material layer.

Such construction permits flowing of a current to the first electrodes or transparent electrodes to be carried out from the conductive paths extending along the first electrodes through the connection conductive sections in the holes formed in the insulating layer. This permits a sufficient amount of current to be fed to the luminous sections positioned on the intersections between the first electrodes and the second electrodes, even when the first electrodes are increased in resistance due to a reduction in width thereof or an increase in length thereof. This results in the organic EL permitting an image plane to exhibit increased luminance or brightness while eliminating any difference in luminescence between the luminous sections.

The conductive paths may be constituted by a plurality of divided conductive sections kept from being electrically connected to each other. In other words, the conductive path for feeding a current to each of the first electrodes may be constituted by a plurality of such divided conductive sections. In this instance, the second electrodes are divided into n (n: positive integer) groups each including a predetermined number of second electrodes successively arranged. The divided electrodes constituting the first electrodes and the divided conductive sections constituting the conductive paths are arranged so as to correspond to the n groups of the second electrodes. Such construction permits feeding of a current to the first electrodes or transparent electrodes to be controlled for each of units of n in number formed in correspondence to n groups of the second electrodes, resulting in drive and control of the organic EL device being facilitated.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an organic EL device according to the present invention will be described hereinafter with reference to the accompanying drawings.

Figure 4:
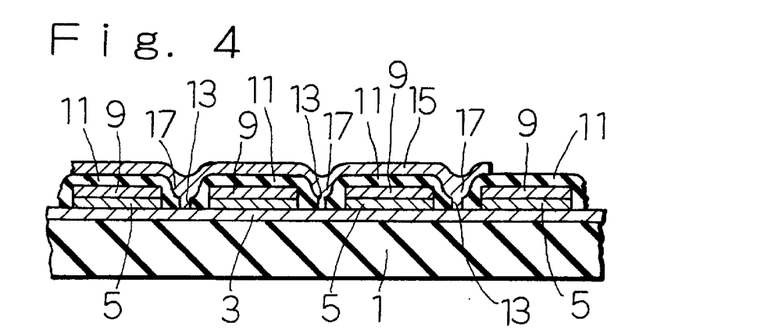
FIG. 4 is a fragmentary schematic sectional view showing a fourth step in manufacturing of an embodiment of an organic EL device according to the present invention.
Figure 5:
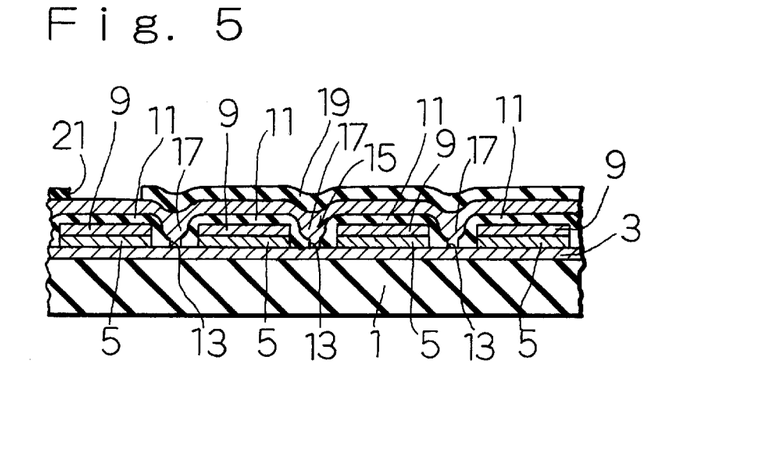
FIG. 5 is a fragmentary schematic sectional view showing a fifth step in manufacturing of an embodiment of an organic EL device according to the present invention.
Figure 6:
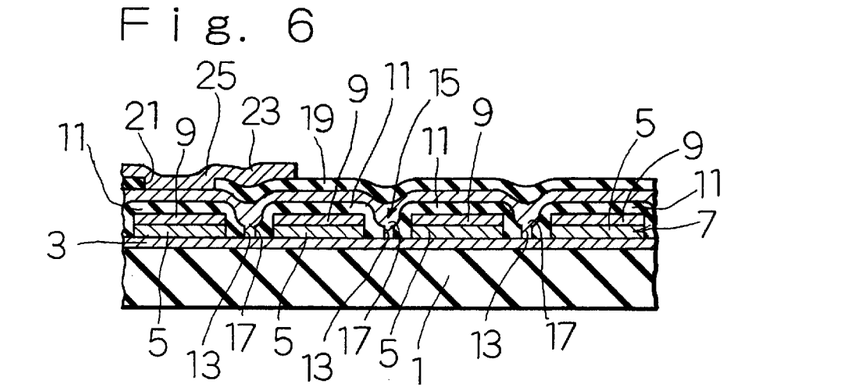
FIG. 6 is a fragmentary schematic sectional view showing a sixth step in manufacturing of an embodiment of an organic EL device according to the present invention.

Referring first to FIGS. 1 to 7 and FIGS. 8 to 11, manufacturing of a first embodiment of an organic EL device according to the present invention is illustrated. An organic EL device of the illustrated embodiment is basically constructed in such a manner as shown in FIG. 6. First of all, a general structure of the organic EL device of the illustrated embodiment will be briefly described with reference to FIG. 6. The organic EL device includes a transparent insulating substrate 1, which is formed on a front surface thereof with a first wiring pattern. The first wiring pattern includes a plurality of first stripe-like elongated electrodes 3 formed of a transparent electrode material such as indium-tin oxide (ITO) or the like and arranged in a manner to be spaced from each other at predetermined intervals while being juxtaposed to each other. The transparent electrodes or first electrodes 3 each are formed thereon with a plurality of luminous sections 5, which are made of an organic EL material and arranged so as to be spaced from each other in a direction in which the first electrodes 3 extend. The luminous sections 5, as described below, each constitute a part of a luminous material layer 7.

The luminous material layer 7 is formed thereon with a second wiring pattern, which are constituted of a plurality of second electrodes 9 arranged on the luminous material layer 7 in a manner to intersect the first electrodes 3 and be spaced from each other at predetermined intervals. The luminous sections 5 each are defined at each of intersections between the first electrodes 3 and the second electrodes 9.

The organic EL device of the illustrated embodiment also includes an electrical insulating layer 11 arranged so as to cover the first wiring pattern and second wiring pattern. The insulating layer 11 is formed with a plurality of hole arrays in correspondence to the first electrodes 3. The hole arrays each include a plurality of holes 13 arranged along the first electrode 3 corresponding thereto and so as to extend to the first electrodes through the insulating layer 11 while being kept from penetrating or extending through the second electrodes 9.

The insulating layer 11 is formed thereon with a plurality of conductive paths 15 arranged along the hole arrays constituted of the holes 13. The conductive paths 15 each are electrically connected to the first electrode 3 through a plurality of conductive sections 17 for connection formed in the holes 13 of the hole array corresponding thereto. The conductive paths 13 constitute a third wiring pattern.

The third pattern constituted by the conductive paths 15 formed on the insulating layer 11 is formed thereon with an additional electrically insulating layer 19 in a manner to cover the whole third wiring pattern. The insulating layer 19 is formed with a plurality of electrode connection holes 21 in a manner to correspond to the conductive paths 15 and extend to the corresponding conductive paths 15 through the insulating layer 19. The insulating layer 19 is formed thereon with a plurality of connection electrodes 23 in a manner to correspond to the electrode connection holes 21. The connection electrodes 23 are electrically connected to the conductive paths 15 corresponding thereto through a plurality of electrode connection conductive sections 25 formed in the electrode connection holes 21, respectively.

Now, manufacturing of the organic EL device of the illustrated embodiment thus constructed will be described hereinafter with reference to FIGS. 1 to 11.

Figure 1:
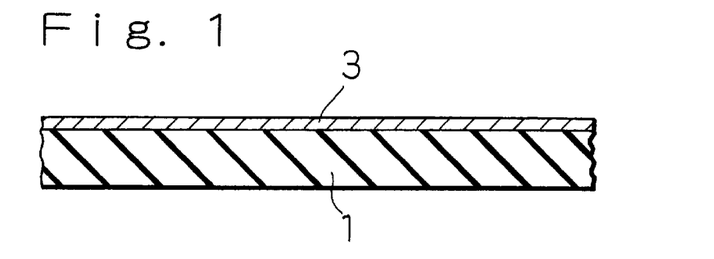
FIG. 1 is a fragmentary schematic sectional view showing a first step in manufacturing of an embodiment of an organic EL device according to the present invention.

First of all, as shown in FIG. 1, the transparent insulating substrate 1 which may be made of a transparent material such as glass, quartz, resin or the like is formed on one surface thereof or a front surface thereof with an electrode film, which may be made of a transparent electrode material such as ITO or the like by vacuum film formation techniques such as vapor deposition, sputtering or the like. Then, the electrode film is subject to etching, so that a plurality of the transparent electrodes or first electrodes 3 may be formed in a manner to be juxtaposed to each other while being spaced in parallel from each other at predetermined intervals. The substrate 1 may be formed into a size of 100 mm×100 mm and a thickness of about 1 mm and the first electrodes 3 may be formed into a width of 0.4 mm while keeping a space of 0.1 mm between each adjacent two of the first electrodes 3.

Figure 2:
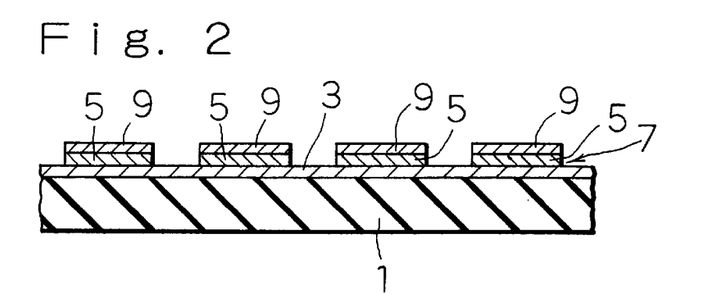
FIG. 2 is a fragmentary schematic sectional view showing a second step in manufacturing of an embodiment of an organic EL device according to the present invention.

Then, as shown in FIG. 2, the luminous material layer 7 is formed on the first electrodes 3 by means of a mask by vacuum film formation techniques such as vapor deposition or the like. The luminous material layer 7, as described above, is constituted of a plurality of luminous material arrays arranged so as to be perpendicular to the first electrodes 3 and juxtaposed in parallel to each other. A portion of the luminous material layer 7 positioned on each of the first electrodes 3 constitutes each of the luminous sections 5. More specifically, the luminous material layer 7 is constituted by, for example, a hole transport material layer of about 500 Å in thickness and an electron transport material layer of about 500 Å in thickness which are laminated on each other. The luminous material arrays constituting the luminous material layer 7 each are formed into a width of 0.4 mm while keeping a space of 0.1 mm between each adjacent two thereof.

Materials for the hole transport material layer of the luminous material layer 7 include triphenyl amine derivatives (TPD), hydrazone derivatives, aryl amine derivatives and the like. Materials for the electron transport material layer include an aluminum quinolinol complex ($Alq_3$), distyryl biphenyl derivatives (DPVBi), oxadiazole derivatives, bistyryl anthracene derivatives, benzoxazole thiophene derivatives, perylenes, thiazoles and the like. Alternatively, the luminous material layer 7 may be made of a mixture obtained by mixing the hole transport material with a suitable luminous material. The luminous material layer 7 may be made of a mixture of the hole transport material and electron transport material. In this instance, the hole transport material and electron transport material may be mixed with each other at a ratio of between 10:90 and 90:10.

The luminous material layer 7 may be made in the form of a thin film by vacuum deposition of a low-molecular organic material, spin coating of a high-molecular material, casting of a high-molecular material, or the like. The vacuum deposition may provide a laminate constituted by a combination of a hole transport layer obtained by laminating a triphenyl amine derivative (TPD) layer and an aluminum quinolinol complex ($Alq_3$) layer on each other with a luminous layer (electron transport layer). The vacuum deposition also may provide a three-layer structure in which a luminous layer is interposedly arranged between a hole transport layer and an electron transport layer. Further, the vacuum deposition may provide a mixed-type single-layer structure wherein a hole transport layer, an electron transport layer, a luminous layer, a doped layer and the like are mixed together. Application of spin coating or casting to formation of the luminous layer may likewise provide substantially the same layer structures as in the vacuum deposition.

The luminous material layer 7 may be provided in the form of a film by vapor deposition carried out, for example, under conditions that a degree of vacuum is set to be $6\times10^{-6}$ Torr and a deposition rate is set to be 50 Å/sec. Alternatively, the luminous material layer 7 may be formed by flash deposition. The flash deposition may be carried out in such a manner that an organic EL material obtained by mixing at a predetermined ratio is dropped onto a deposition source heated to a temperature of 300 to 600° C. and preferably 400 to 500° C., resulting in being subject to flash evaporation. Alternatively, it may be carried out by placing the organic EL material in a container and rapidly heating the container, leading to flash evaporation of the material.

The luminous material layer 7 is formed on a front surface thereof with a plurality of the above-described second electrodes or rear electrodes 9, which may be made of, for example, Al—Li alloy of about 99% in purity containing 0.01 to 0.05% of Li. The second electrodes 9 each are formed into a thickness of about 2000 Å. This results in the second electrodes 9 being arranged so as to be perpendicular to the first electrodes 3 and juxtaposed in parallel to each other. The second electrodes 7 are made by mask deposition. More particularly, the luminous material layer 7 is covered at a portion thereof on which the second electrodes 9 are not arranged with a mask. Then, the portion of the luminous material layer 7 is subject to deposition in a vertical direction.

Figure 3:
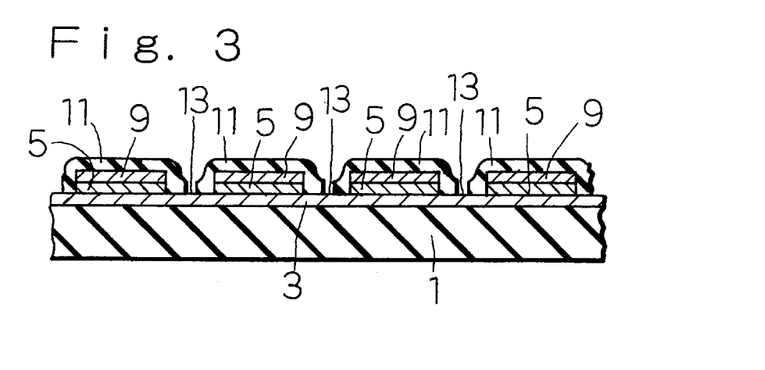
FIG. 3 is a fragmentary schematic sectional view showing a third step in manufacturing of an embodiment of an organic EL device according to the present invention.
Figure 8:
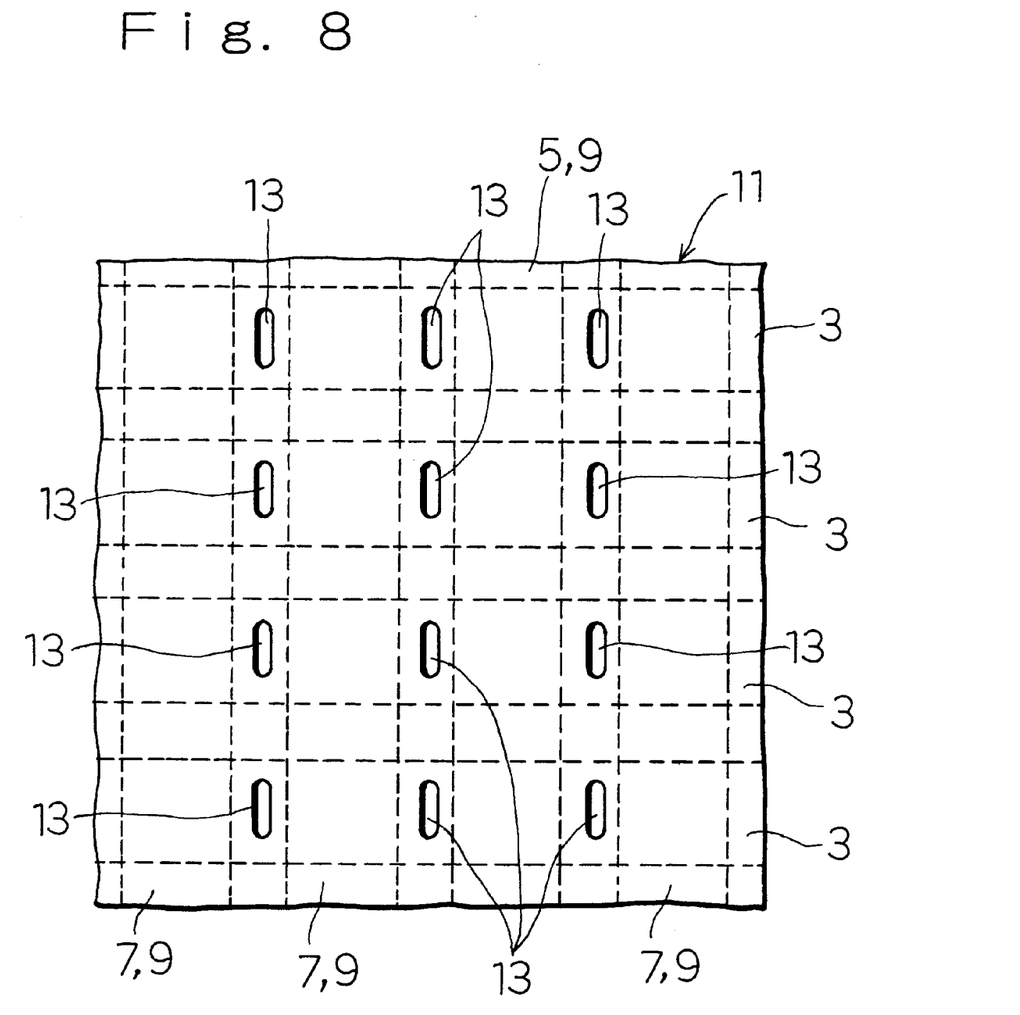
FIG. 8 is a fragmentary schematic plan view showing an organic EL device in the third step of FIG. 3.

Then, as shown in FIG. 3, the electrically insulating layer 11 is formed of $SiO_2$ or the like on the front surface of the substrate 1 so as to cover the first electrodes 3 and second electrodes 9. The insulating layer 11, as shown in FIGS. 3 and 8, is formed with the hole arrays each constituted of a plurality of holes 13. The holes 13 for each of the hole arrays are arranged in alignment with the corresponding first electrode 13 and so as to extend through the insulating layer 11 to the first electrode 3 while being kept from penetrating or extending through the second electrodes. The holes 13 each are formed into an elongated elliptic shape. The insulating layer 11 is preferably formed into a dense film under conditions of a low temperature in view of the luminous material layer 4 made of an organic material. Materials for the insulating layer 11 include those exhibiting insulating properties or semi-insulating properties such as SiOx, SiN, GeOx, $Al_2O_3$ and the like. The insulating layer 11 may be conveniently formed by vapor deposition, sputtering or the like. The holes 13 may be formed by etching after formation of the insulating layer 11. The etching may be executed by RIE or wet etching.

Figure 9:
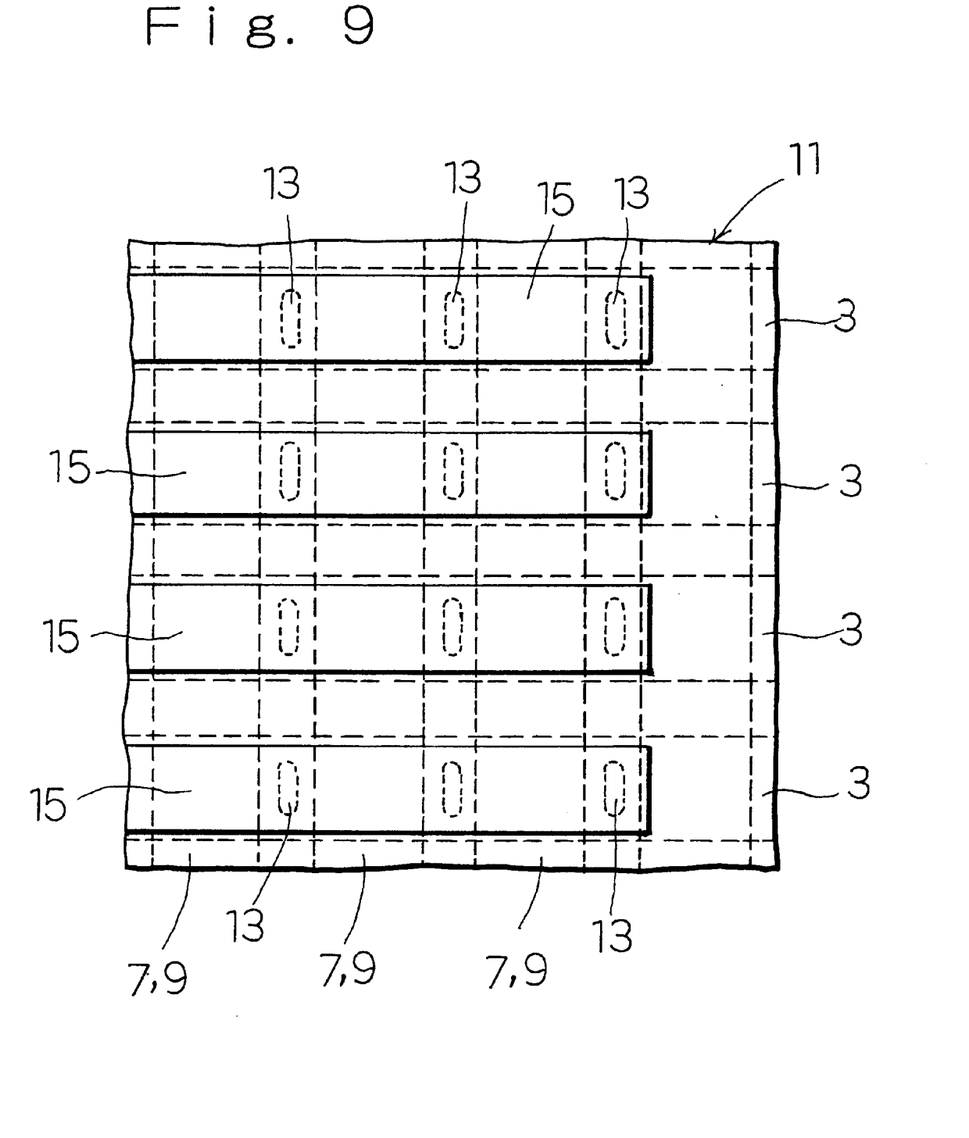
FIG. 9 is a fragmentary schematic plan view showing an organic EL device in the fourth step of FIG. 4.

Then, a plurality of the conductive paths 15, as shown in FIGS. 4 and 9, are formed on the insulating layer 11, which are arranged in alignment with the first electrodes 3 and in parallel to each other. More specifically, the conductive paths 15 each are formed on the insulating layer 11 in a manner to be in alignment with each of the hole arrays each constituted of the holes 13. Also, the conductive paths 15 each are electrically connected through the connection conductive sections 17 formed in the holes 13 of the corresponding hole array to each of the first electrodes 3. The conductive paths 15 each are formed into a width slightly smaller than that of the first electrode 3. The conductive paths 15 may be formed by either forming an Al film on the front surface of the insulating layer 11 by vapor deposition and then subjecting it to etching or forming an Al film by vapor deposition using a mask.

Figure 10:
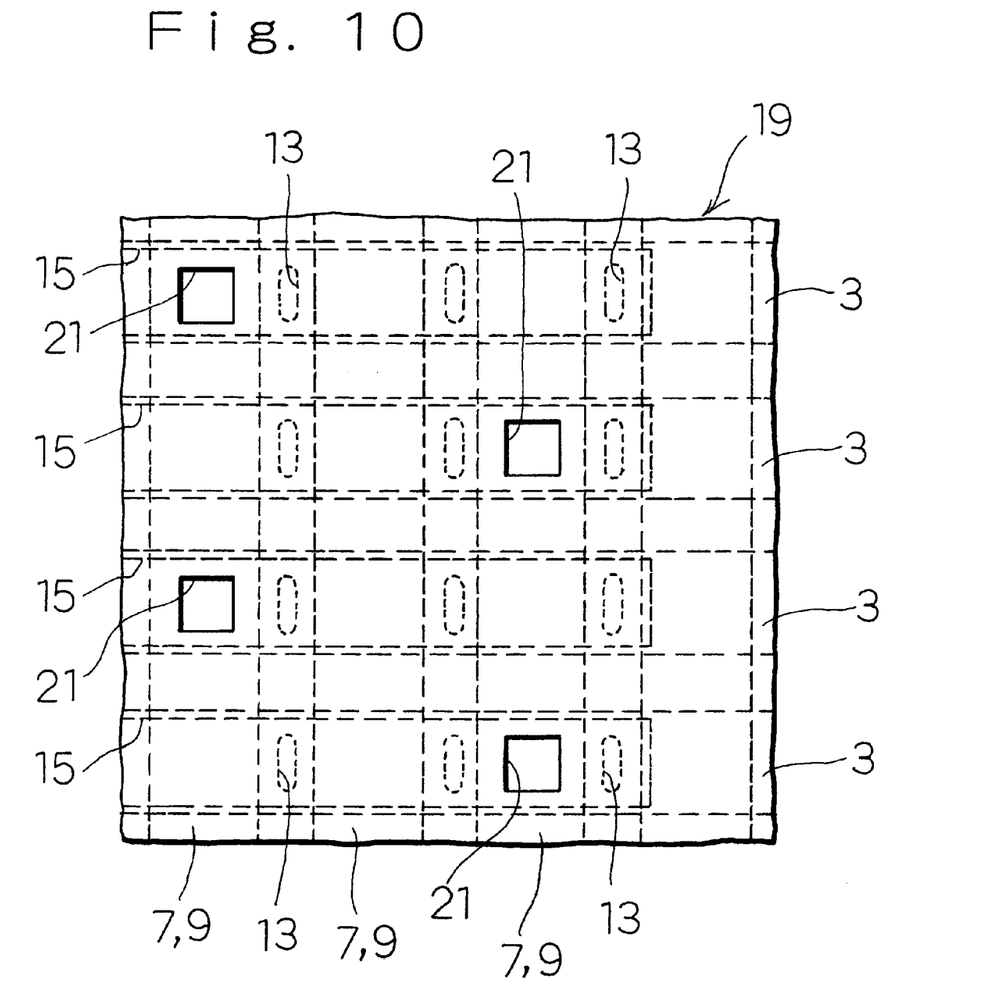
FIG. 10 is a fragmentary schematic plan view showing an organic EL device in the fifth step of FIG. 5.

Subsequently, the additional electrically insulating layer 19 is formed on the third wiring pattern constituted of the conductive paths 15, as shown in FIGS. 5 and 10. The insulating layer 19 may be formed of $SiO_2$ or the like by vacuum film formation techniques as in the insulating layer 11. The insulating layer 19 may be formed into a thickness of about 1000 Å. The insulating layer 19 is formed with a plurality of electrode connection holes 21 in correspondence to the conductive paths 15. The electrode connection holes 12 each are arranged so as to extend through the insulating layer 19 to the conductive path 15 corresponding thereto. The electrode connection holes 21 may be formed by etching, like the holes 13. Also, the electrode connection holes 21 are arranged so as to alternate with each other or in a zigzag-like or staggered manner.

Figure 11:
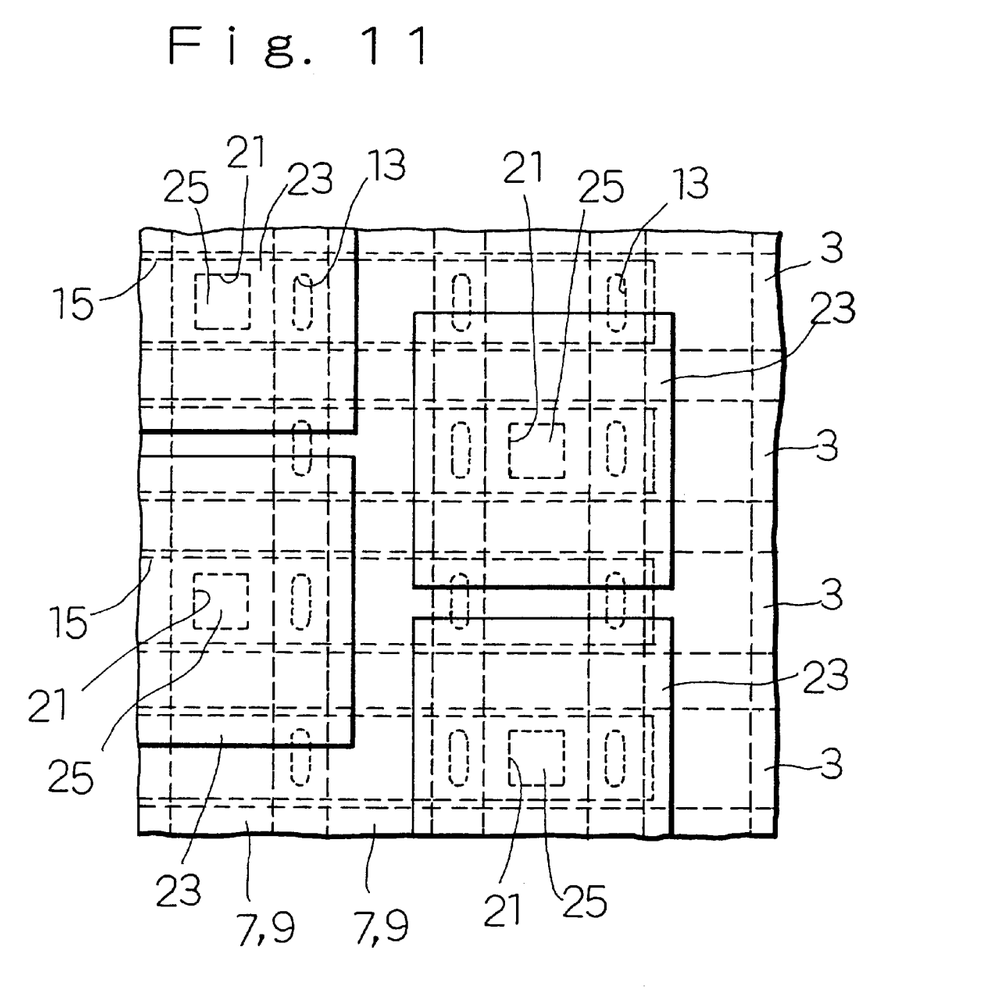
FIG. 11 is a fragmentary schematic plan view showing an organic EL device in the sixth step of FIG. 6.

Thereafter, as shown in FIGS. 6 and 11, the insulating layer 11 is formed thereon with a plurality of the connection electrodes 23 in a manner to correspond to the electrode connection holes 21. The connection electrodes 23 are formed in the electrode connection holes 21 and electrically connected to the conductive paths 15 corresponding thereto by means of the electrode connection conductive sections 25, respectively. The connection electrodes 23 and electrode connection conductive sections 25 may be formed of Al—Li alloy of about 99% in purity containing Li in an amount of about 0.01 to 0.05 by vacuum film formation techniques as in the second electrodes 9. More specifically, they may be formed by vapor deposition using a mask. The connection electrodes 23, as shown in FIG. 11, are arranged in a manner to alternate each other. More particularly, the connection electrodes are separated into a first group connected to odd-numbered ones of the conductive paths 15 and a second group connected to even-numbered ones thereof. The connection electrodes 23 belonging to first group are arranged so as to form a first electrode array and the connection electrodes 23 of the second group are arranged so as to form a second electrode array which is kept from overlapping the first electrode array. Such arrangement permits a size of the connection electrodes 23 to be relatively increased.

Figure 7:
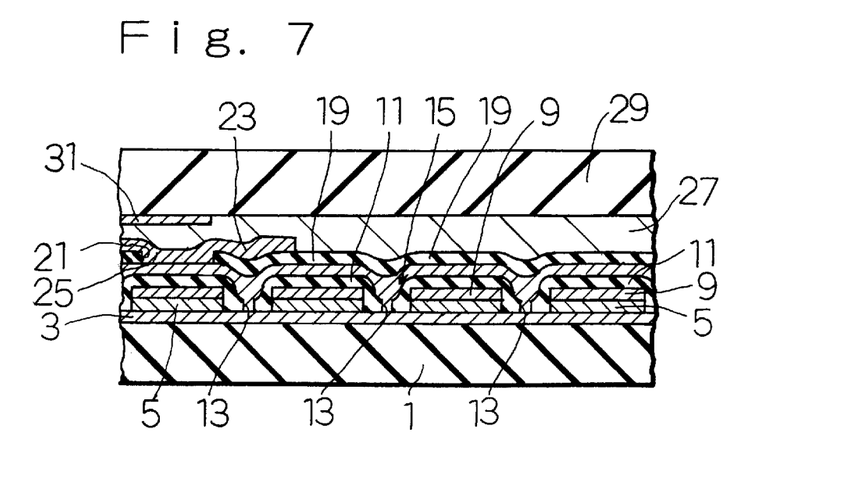
FIG. 7 is a fragmentary schematic sectional view showing an eighth step in manufacturing of an embodiment of an organic EL device according to the present invention.

Also, the organic EL element, as shown in FIG. 7, has a drive circuit substrate 29 which is provided thereon with a drive circuit (not shown) laminated thereon through an anisotropic conductor 27 exhibiting conductivity only in a thickness direction thereof. The drive circuit board 29 is provided on a surface thereof opposite to the insulating layer 19 with a plurality of output electrodes 31, which are electrically connected through the anisotropic conductor 27. The circuit board 29 may be made of, for example, polyimide. The circuit board 29 is formed on a non-joint surface thereof with a circuit pattern on which an IC (not shown) for driving the EL device is mounted. The anisotropic conductor 27 for connecting the connection electrodes 23 and the output electrodes 31 of the circuit board 29 to each other may be commercially available as a sheet-like conductor sold under a tradename UIC (trademark) from SONY CORP. The anisotropic conductor 27 is constructed so as to exhibit joining or bonding properties when it is heated under pressure. The anisotropic conductor 27 is preferably heated to a temperature of 100° C. or below so as to restrain the luminous material layer 7 from being thermally affected. The circuit board 29 is joined through the anisotropic conductor 27 to the insulating layer 19. The anisotropic conductor 27 exhibits conductivity only in a thickness direction thereof, to thereby permit electrical connection to be established only between the output electrodes 31 and the connection electrodes 23 opposite to each other.

The rear electrodes or second electrodes 9 each are provided at an end thereof with the connection electrode 23. The connection electrode 23 is electrically connected through the anisotropic conductor 27 to each of the output electrodes 31 on the circuit board 29.

The organic EL device of the illustrated embodiment thus constructed permits a current to be flowed to a portion of the first electrode 3 in proximity to each of the luminous sections 5 from the conductive path 15 through the connection conductive section 17. This permits a resistance of the transparent electrodes or first electrodes 3 to be substantially neglected. Thus, the organic EL device is driven in such a manner that a current is flowed to the luminous sections 5 while acting each of the transparent first electrodes 3 as a scanning electrode and each of the second electrodes 9 as a parallel electrode. Such driving increases luminous time per one line by scanning the first electrodes 3 when the first electrodes 3 are reduced in number, so that display may be increased in luminance or brightness.

The above-described construction of the illustrated embodiment may provide a single organic EL device. Alternatively, the illustrated embodiment may be constructed in such a manner that the rear electrodes or second electrodes are divided into a plurality of groups, wherein the above-described construction is applied to the second electrodes 9 of each of the groups, to thereby constitute each EL device.

Figure 12:
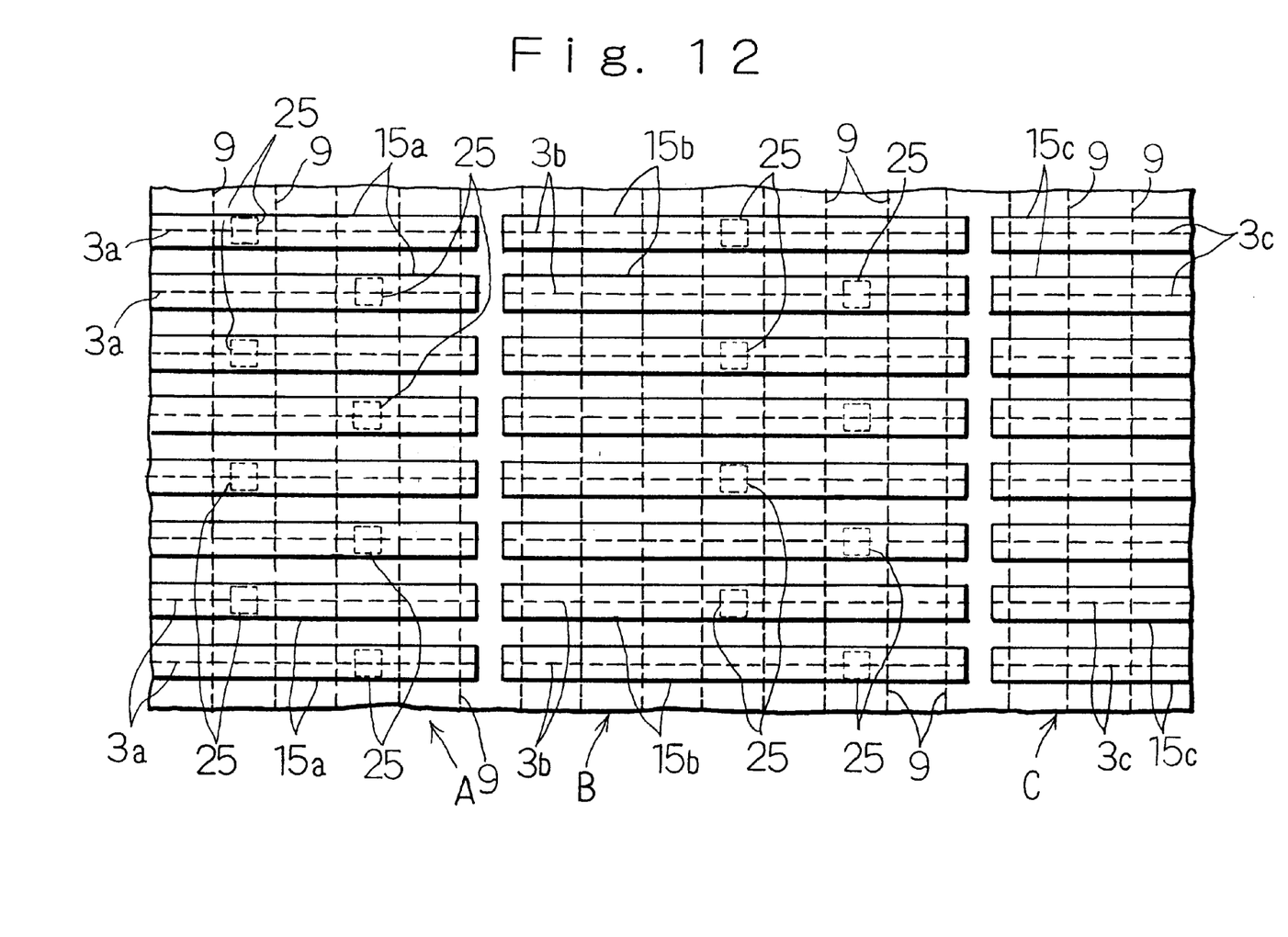
FIG. 12 is a schematic conceptual view showing another embodiment of an organic EL device according to the present invention.

Now, such construction will be described in detail with reference to FIG. 12. In FIG. 12, the first electrodes are constituted of a plurality of divided electrodes $3a$ to $3c$ which are kept from being connected to each other, respectively. Also, the conductive paths are constituted of a plurality of divided conductive sections $15a$ to $15c$ which are not connected to each other, respectively. In FIG. 12, the divided electrodes $3a$ to $3c$ for the first electrodes 3, as well as the second electrodes 9 each are indicated at broken lines. Also, FIG. 12 shows positions at which the connection conductive sections 25 are formed. In this instance, the second electrodes 9 are divided into n (n: positive integer) groups each containing a predetermined number of second electrodes 9. In FIG. 12, they are divided into three groups A to C. The divided electrodes $3a$ to $3c$ each including a plurality of first electrodes and the divided conductive sections $15a$ to $15c$ each including a plurality of conductive paths 15 are arranged in correspondence to the n groups (A to C). Thus, the first electrodes and conductive paths are arranged for each of the n groups of the second electrodes. Such arrangement permits the groups to be driven in parallel while functioning each group of the second electrodes as one unit. This results in luminous time of each of the luminous sections being increased. For example, supposing that the number of the second electrodes 9 is 512, the second electrodes may be divided into four groups each including 128 such second electrodes. Thus, driving of the respective groups in parallel permits luminous time of each of the luminous sections to be increased to four times as compared with simple scanning of 512 such second electrodes. Also, such arrangement permits luminescence of the EL device to be concurrently carried out at four points on a whole image plane of the device, so that luminous time and luminous points each are increased to four times, resulting in luminance or brightness being increased to sixteen times.

The organic EL device of the illustrated embodiment ensures that a resistance of the first electrodes or transparent electrodes may be reduced to a low level substantially equal to that of the second electrodes or rear electrodes, to thereby eliminate unevenness or nonuniformity of luminescence due to a resistance of the first electrodes, resulting in uniform luminance being provided on the image plane. Also, it facilitates formation of blocks or a variation in input which is required for increasing luminous time of the luminous sections and provides the image plane with increased luminance. Further, the organic EL device exhibits increased durability because the luminous material layer 7 is covered with the two insulating layers 11 and 19, resulting in being reliably kept airtight. In addition, when the connection electrodes 23 and the output electrodes 31 of the circuit board 29 are connected to each other through the anisotropic conductor 27, the device may be small-sized while being increased in reliability and strength.

Figure 13:
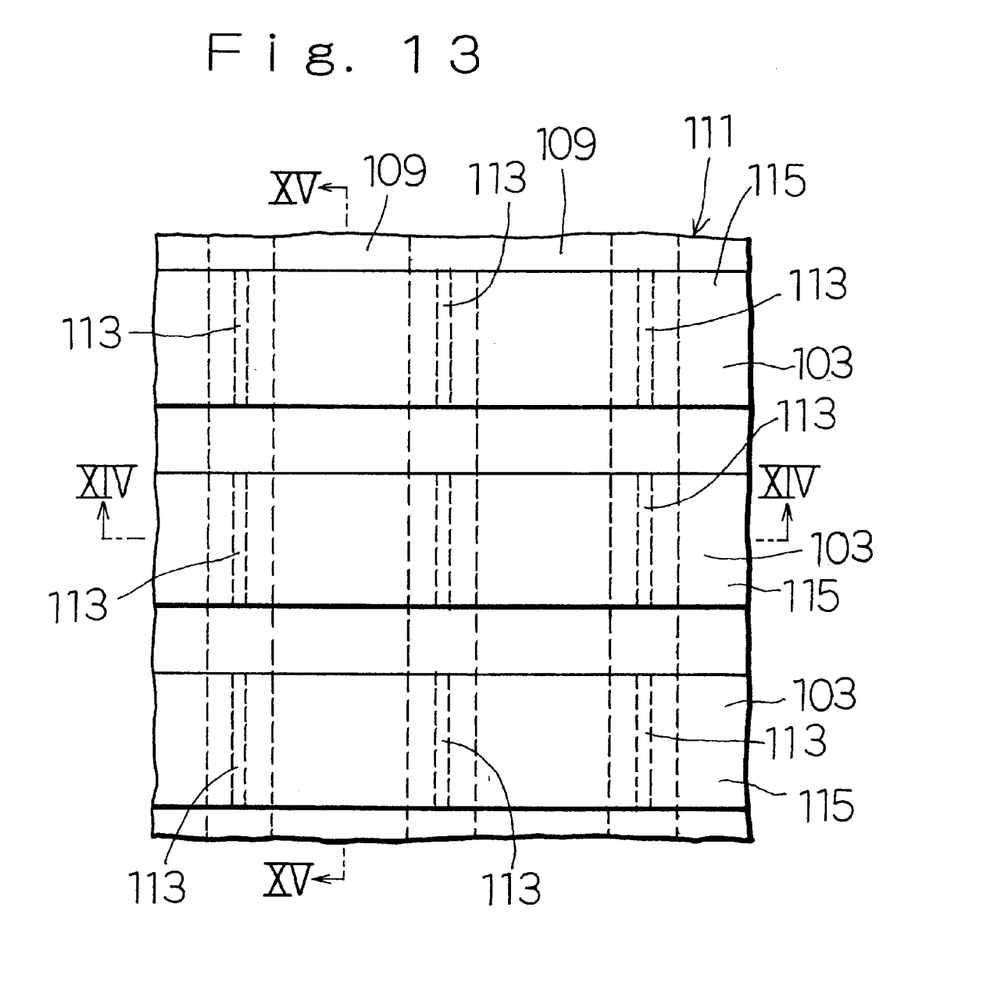
FIG. 13 is a plan view showing an essential part of a further embodiment of an organic EL device according to the present invention.
Figure 14:
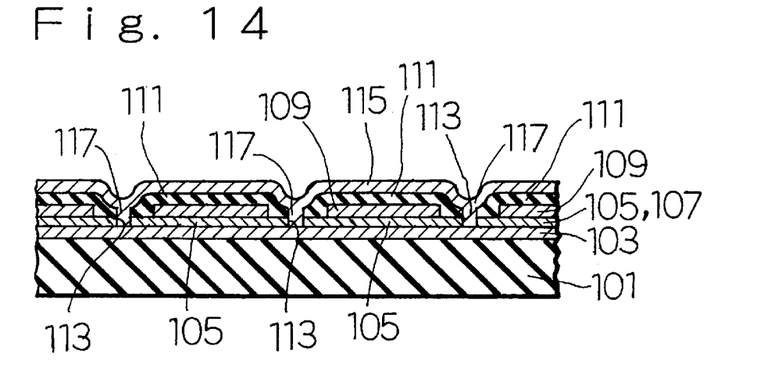
FIG. 14 is a sectional view taken along line XIV—XIV of FIG. 13.
Figure 15:
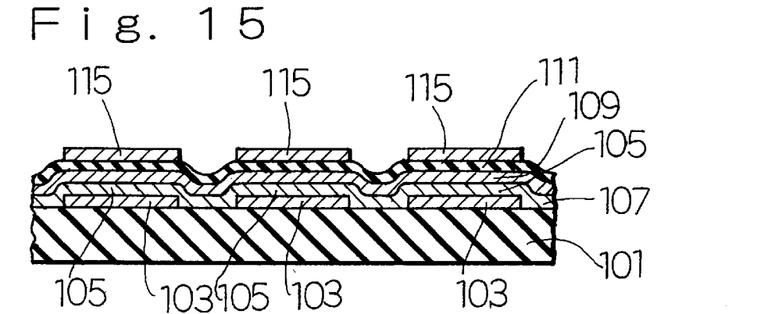
FIG. 15 is a sectional view taken along line XV—XV of FIG. 13.

Referring now to FIGS. 13 to 15, another embodiment of an organic EL device according to the present invention is illustrated. In connection with the illustrated embodiment, reference numerals correspond to those discussed in the embodiment described above, except with an additional prefix 100, i.e., such that the insulating substrate 1 previously shown is now an insulating substrate 101, etc. The illustrated embodiment is substantially the same manner as the embodiment described above, except that a luminous material layer 107 is formed all over a front surface of an insulating substrate 101, a plurality of holes 113 are formed so as to extend through both insulating layer and luminous material layer 107 to first electrodes 103, the holes 113 are formed into an elongated rectangular shape, and the first electrodes 103 are formed into a different configuration in section.

In the illustrated embodiment, the holes 113 are formed by etching carried out only once or single etching. Thus, the insulating layer 111 and luminous material layer 107 are concurrently subject to etching, resulting in formation of the holes 113. In this instance, in order to ensure that electroluminescence laterally emitted from the luminous material layer 107 is directed toward the substrate 101, a connection conductive section 117 is preferably formed of a light reflecting material such as Al, Al—Li alloy or the like. In the illustrated embodiment, the luminous material layer 107 and connection conductive section 117 are permitted to be contacted with each other in the holes 113. However, the luminous material layer 107 is formed into a thickness as small as hundreds of angstroms, so that a current flowing through the contacted portion may be highly reduced as compared with a current flowing between the first electrodes 103 and the second electrodes 109, resulting in being substantially negligible.

Figure 16:
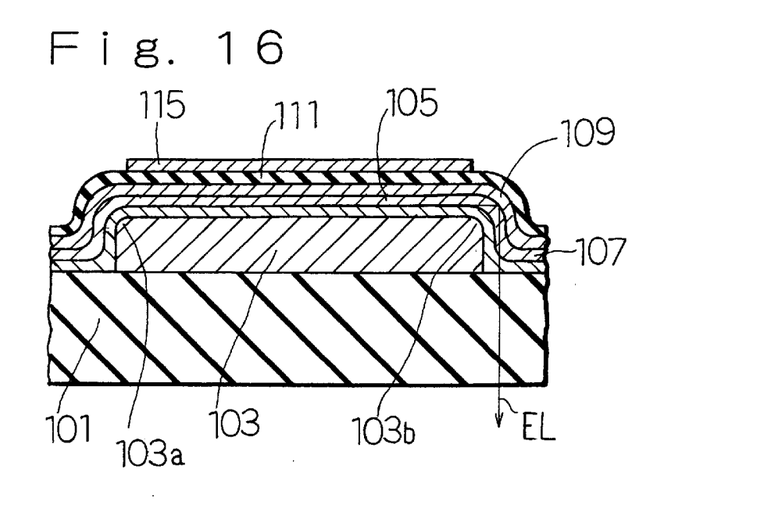
FIG. 16 is a fragmentary sectional view showing a modification of a first electrode.

Also, in the illustrated embodiment, the first electrodes 103 each are so formed that two corners 103a and 103b thereof on a side thereof on which the first electrode is not contacted with the substrate 101 are curved or rounded. Such formation of the curved corners 103a and 103b may be attained by subjecting the first electrode 103 to etching and then subjecting it to etching again for a short period of time while keeping a mask released therefrom. This permits an inner surface portion of each of the second electrodes 109 corresponding to the corners 103a and 103b to be likewise curved, to thereby ensure that light emitted from an interface of luminous sections of the luminous material layer 107 may be positively reflected toward the transparent substrate 101.

In the illustrated embodiment, the insulating layer 111 and luminous material layer 107 may be subject to single etching, resulting in reducing the number of etching steps.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An organic EL device comprising:

a transparent insulating substrate;

a first wiring pattern constituted of a plurality of first electrodes formed of a transparent electrode material and arranged on a front surface of said insulating substrate in a manner to be spaced from each other at predetermined intervals while being juxtaposed to each other;

a luminous material layer made of an organic EL material and including a plurality of luminous sections arranged on said first electrodes in a manner to be spaced from each other at predetermined intervals in a direction in which said first electrodes extend;

a second wiring pattern constituted of a plurality of second electrodes which are formed on said luminous material layer and arranged so as to intersect said first electrodes and in a manner to be juxtaposed to each other while being spaced from each other at predetermined intervals;

said luminous sections each being defined at each of intersections between said first electrodes and said second electrodes;

an electrically insulating layer arranged so as to cover said first wiring pattern and second wiring pattern;

said insulating layer being formed with a plurality of hole arrays in a manner to respectively correspond to said first electrodes;

said hole arrays each being constituted of a plurality of holes arranged along the first electrode corresponding thereto and so as to extend through said insulating layer to said first electrode while being kept from extending through said second electrodes;

said holes of each of said hole arrays each being formed therein with a connection conductive section; and a third wiring pattern constituted of a plurality of conductive paths each arranged on said insulating layer so as to be in alignment with each of said hole arrays and electrically connected to each of said first electrodes through said connection conductive sections formed in said holes of said hole array corresponding thereto.

2. An organic EL device as defined in claim 1, wherein said luminous material layer is constituted of a plurality of luminous material arrays positioned below said second electrodes and arranged so as to intersect said first electrodes.

3. An organic EL device as defined in claim 1, wherein said luminous material layer is arranged so as to cover the whole front surface of said insulating substrate on which said first wiring pattern is formed; and said holes of each of said hole arrays are formed so as to extend through said luminous material layer.

4. An organic EL device as defined in claim 1, further comprising:

an additional electrically insulating layer arranged on said third wiring pattern so as to entirely cover said third wiring pattern;

said additional electrically insulating layer being formed with a plurality of electrode connection holes in correspondence to said conductive paths in a manner to extend through said additional electrically insulating layer to said conductive paths, respectively;

a plurality of connection electrodes formed on said additional electrically insulating layer in correspondence to said electrode connection holes; and a plurality of electrode connection conductive sections formed in said electrode connection holes to electrically connect said connection electrodes to said conductive paths corresponding thereto, respectively.

5. An organic EL device as defined in claim 4, wherein said connection electrodes each are formed so as not to be arranged in a direction in which the connection electrodes adjacent thereto and said conductive paths are arranged.

6. An organic EL device as defined in claim 4, further comprising:

a drive circuit board arranged opposite to said additional electrically insulating layer and provided thereon with a drive circuit;

said drive circuit board being provided on a surface thereof opposite to said additional electrically insulating layer with a plurality of output electrodes connected to said connection electrodes; and an anisotropic conductor arranged between said additional electrically insulating layer and said drive circuit board and constructed so as to exhibit conductivity only in a width direction thereof;

said connection electrodes and output electrodes being electrically connected to each other through said anisotropic conductor.

7. An organic EL device as defined in claim 1, wherein said first electrodes each have two corners kept non-contacted with said insulating substrate and formed into a curved shape; and said second electrodes each are formed of a light reflecting material.

8. An organic EL device as defined in claim 3, wherein said first electrodes each have two corners kept non-contacted with said insulating substrate and formed into a curved shape;

said second electrodes are formed of a light reflecting material; and said connection conductive sections are made of a light reflecting material.

9. An organic EL device comprising:

a transparent insulating substrate;

a first wiring pattern constituted of a plurality of first electrodes formed of a transparent electrode material and arranged on a front surface of said insulating substrate in a manner to be spaced from each other at predetermined intervals while being juxtaposed to each other;

a luminous material layer made of an organic EL material and including a plurality of luminous sections arranged on said first electrodes in a manner to be spaced from each other at predetermined intervals in a direction in which said first electrodes extend;

a second wiring pattern constituted of a plurality of second electrodes which are formed on said luminous material layer and arranged so as to intersect said first electrodes and in a manner to be juxtaposed to each other while being spaced from each other at predetermined intervals;

said luminous sections each being defined at each of intersections between said first electrodes and said second electrodes;

an electrically insulating layer arranged so as to cover said first wiring pattern and second wiring pattern;

said insulating layer being formed with a plurality of hole arrays in a manner to respectively correspond to said first electrodes;

said hole arrays each constituted of a plurality of holes arranged along the first electrode corresponding thereto and so as to extend through said insulating layer to said first electrode while being kept from extending through said second electrodes;

said holes of each of said hole arrays each formed therein with a connection conductive section; and a third wiring pattern constituted of a plurality of conductive paths each arranged on said insulating layer so as to be in alignment with each of said hole arrays and electrically connected to each of said first electrodes through said connection conductive sections formed in said holes of said hole array corresponding thereto;

said first electrodes being constituted by a plurality of divided electrodes kept from being electrically connected to each other;

said conductive paths being constituted by a plurality of divided conductive sections kept from being electrically connected to each other.

10. An organic EL device as defined in claim 9, wherein said luminous material layer is constituted of a plurality of luminous material arrays positioned below said second electrodes and arranged so as to intersect said first electrodes.

11. An organic EL device as defined in claim 9, wherein said luminous material layer is arranged so as to cover the whole front surface of said insulating substrate on which said first wiring pattern is formed; and said holes of each of said hole arrays are formed so as to extend through said luminous material layer.

12. An organic EL device as defined in claim 9, further comprising:

an additional electrically insulating layer arranged on said third wiring pattern so as to entirely cover said third wiring pattern;

said additional electrically insulating layer being formed with a plurality of electrode connection holes in correspondence to said divided conductive sections constituting said conductive paths in a manner to extend through said additional electrically insulating layer to said divided conductive sections, respectively;

a plurality of connection electrodes formed on said additional electrically insulating layer in correspondence to said electrode connection holes; and a plurality of electrode connection conductive sections formed in said electrode connection holes to electrically connect said connection electrodes to said divided conductive sections corresponding thereto, respectively.

13. An organic EL device as defined in claim 12, further comprising:

a drive circuit board arranged opposite to said additional electrically insulating layer and provided thereon with a drive circuit;

said drive circuit board being provided on a surface thereof opposite to said additional electrically insulating layer with a plurality of output electrodes connected to said connection electrodes; and an anisotropic conductor arranged between said additional electrically insulating layer and said drive circuit board and constructed so as to exhibit conductivity only in a width direction thereof;

said connection electrodes and output electrodes being electrically connected to each other through said anisotropic conductor.

14. An organic EL device as defined in claim 9, wherein said second electrodes are divided into n (n: positive integer) groups each including a predetermined number of second electrodes successively arranged; and said divided electrodes constituting said first electrodes and said divided conductive sections constituting said conductive paths are arranged so as to correspond to said n groups of said second electrodes.

15. An organic EL device as defined in claim 10, wherein said second electrodes are divided into n (n: positive integer) groups each including a predetermined number of second electrodes successively arranged; and said divided electrodes constituting said first electrodes and said divided conductive sections constituting said conductive paths are arranged so as to correspond to said n groups of said second electrodes.

16. An organic EL device as defined in claim 11, wherein said second electrodes are divided into n (n: positive integer) groups each including a predetermined number of second electrodes successively arranged; and said divided electrodes constituting said first electrodes and said divided conductive sections constituting said conductive paths are arranged so as to correspond to said n groups of said second electrodes.

* * * * *